(12) United States Patent
Oladeji

(10) Patent No.: US 8,372,163 B2
(45) Date of Patent: Feb. 12, 2013

(54) METHOD OF FORMING SOLID STATE ELECTROLYTE HAVING HIGH LITHIUM ION CONDUCTION AND BATTERY INCORPORATING SAME

(75) Inventor: Isaiah O. Oladeji, Gotha, FL (US)

(73) Assignee: Sisom Thin Films, LLC, Orlando, FL (US)

( * ) Notice: Subject to any disclaimer, the term of this patent is extended or adjusted under 35 U.S.C. 154(b) by 0 days.

(21) Appl. No.: 13/573,094

(22) Filed: Aug. 20, 2012

(65) Prior Publication Data

US 2012/0317797 A1    Dec. 20, 2012

Related U.S. Application Data

(60) Division of application No. 12/798,515, filed on Apr. 6, 2010, which is a continuation-in-part of application No. 12/656,000, filed on Jan. 12, 2010, now Pat. No. 7,793,611.

(51) Int. Cl.
*H01M 10/26*    (2006.01)
*B05D 5/12*    (2006.01)

(52) U.S. Cl. ..................... 29/623.5; 427/123

(58) Field of Classification Search .............. 29/623.5; 427/123
See application file for complete search history.

(56) References Cited

U.S. PATENT DOCUMENTS

| 6,025,094 | A | * | 2/2000 | Visco et al. | 429/231.95 |
| 8,114,171 | B2 | * | 2/2012 | Visco et al. | 29/623.1 |
| 2002/0018939 | A1 | * | 2/2002 | Kugai et al. | 429/321 |
| 2007/0172739 | A1 | * | 7/2007 | Visco et al. | 429/322 |

* cited by examiner

*Primary Examiner* — Gregg Cantelmo
(74) *Attorney, Agent, or Firm* — Robert J. Lauf

(57) ABSTRACT

A method for making ion conducting films includes the use of primary inorganic chemicals, which are preferably water soluble; formulating the solution with appropriate solvent, preferably deionized water; and spray depositing the solid electrolyte matrix on a heated substrate, preferably at 100 to 400° C. using a spray deposition system. In the case of lithium, the deposition step is then followed by lithiation or addition of lithium, then thermal processing, at temperatures preferably ranging between 100 and 500° C., to obtain a high lithium ion conducting inorganic solid state electrolyte. The method may be used for other ionic conductors to make electrolytes for various applications. The electrolyte may be incorporated into a lithium ion battery.

12 Claims, 8 Drawing Sheets

3A

3B

3C

METHOD OF FORMING SOLID STATE ELECTROLYTE HAVING HIGH LITHIUM ION CONDUCTION AND BATTERY INCORPORATING SAME

CROSS-REFERENCE TO RELATED APPLICATIONS

This application is a divisional of U.S. patent application Ser. No. 12/798,515, filed on Apr. 6, 2010, which is in turn a continuation-in-part of U.S. patent application Ser. No. 12/656,000, filed on Jan. 12, 2010, now U.S. Pat. No. 7,793,611, entitled "Film Growth System and Method," and is also related to U.S. patent application Ser. Nos. 12/151,562 filed on May 7, 2008, now U.S. Pat. No. 7,700,161, entitled "Film Growth System and Method," 12/151,465, filed on May 7, 2008, entitled "Zinc Oxide Film and Method of Making," now abandoned, and 12/462,146, now U.S. Pat. No. 7,972,899, filed on Jul. 30, 2009, entitled "Method for Fabricating Cu-Containing Ternary and Quaternary Chalcogenide Thin Films," all by the present inventor, the entire disclosures of which are incorporated herein by reference. This application is related to U.S. patent application Ser. Nos. 12/798,519, entitled, "Apparatus and Method for Depositing Alkali Metals," and 12/798,510 entitled Solid State Electrolytes Having High Li Ion Conduction," both filed on Apr. 6, 2010 by the present inventor, the entire disclosures of which are incorporated herein by reference.

BACKGROUND OF THE INVENTION

1. Field of the Invention

The invention pertains to apparatus and methods for chemically depositing a solid state alkali, preferably lithium, ion conducting electrolyte on a substrate, and methods for incorporating the electrolyte into a battery.

2. Description of Related Art

Lithium ion battery provides the highest energy density and specific energy of any battery chemistry. Hence it is considered as a promising candidate for transportation and stationary energy storage applications. However, dramatic improvements are required in safety, energy density, cycle life and cost before these batteries are adopted for widespread use in transportation. Safety problems arise mainly from the presence of volatile organic solvents and cathode materials, which undergo exothermic reactions under certain operational and abuse conditions, potentially leading to catastrophic thermal runaway. The presence of liquids also causes lithium dendrite growth under conditions of uneven current distributions, especially at high rates of charge/discharge. Finally, traditional Li-ion cell manufacturing is extremely capital-intensive creating substantial financial barriers to scaling manufacturing. The best solution is to use inorganic, solid-state components, which eliminate the problems caused by liquid electrolyte systems. In addition to improved safety advantages, they also provide the flexibility to use higher energy cathode materials, substantially increase energy density, and greatly extend cycle life.

Though thio-LISICON solid state electrolytes of the form LiSP, LiSiPS, LiGePS, or in general $Li_xM_{1-y}M'_yS_4$ (M=Si, Ge, and M'=P, Al, Zn, Ga, Sb) have been found with ionic conductivity comparable to that of liquid electrolyte [see Masahiro et al., Solid State Ionics 170:173-180 (2004)], the method of growth is often expensive and cumbersome, and the resulting electrolyte materials are in pellet, ceramic/glass plate, or powder forms, making their integration in a large format solid state lithium ion battery difficult to implement.

Seino et al., in U.S. Pat. Appl. Pub. 2009/0011339A1 disclose a lithium ion-conducting solid electrolyte comprising high purity lithium sulfide ($Li_2S$), diboron trisulfide ($B_2S_3$), and compound represented by $Li_aMO_b$; where $Li_aMO_b$ is either lithium silicate ($Li_4SiO_4$), lithium borate ($Li_3BO_3$), or lithium phosphate ($Li_3PO_4$). The powder of these compounds were mixed together in the right proportion and pelletized. The pellets were subjected to 800° C. for 4 hours for melt reaction. After cooling the pellet was further subjected to heat treatment at 300° C. to form high lithium ion conducting solid electrolyte.

Kugai et al., in U.S. Pat. No. 6,641,863 used vacuum evaporation, vacuum laser ablation, or vacuum ion plating to deposit a thin film of solid electrolyte with preferred thickness of 0.1 to 2 μm on the anode. The film electrolyte is obtained by evaporating a mixture of $Li_2S$, A, and B compounds; where A is $GeS_2$, $Ga_2S_3$, or $SiS_2$, and B is $Li_3PO_{4-x}N_{2x/3}$, $Li_4SiO_{4-x}N_{2x/3}$, $Li_4GeO_{4-x}N_{2x/3}$ (with 0<x<4), or $Li_3BO_{3-x}N_{2x/3}$ (with 0<x<3). The electrolyte film is deposited on the anode to block the Li dendrite growth in liquid electrolyte based lithium ion secondary batteries. In-situ or post deposition heat treatment at temperatures ranging between 40 to 200° C. is done to increase the lithium ion conductivity of the solid state electrolyte film to a value that is comparable to that of liquid electrolyte.

Minami et al., [see Solid State Ionics 178:837-41 (2007)], used mechanical ball milling to mix selected proportions of $Li_2S$ and $P_2S_5$ crystalline powders at 370 rpm for 20 hours. The finely milled powder mixture is then heated in a sealed quartz tube at temperature of 750° C. for 20 hours to form a molten sample. This was quenched with ice to form $70Li_2S\cdot30P_2S_5$ glass. The glass was then annealed at 280° C. to form $70Li_2S\cdot30P_2S_5$ ceramic glass ($Li_7P_3S_{11}$) with an ionic conductivity of about $2.2\times10^{-3}$ S cm$^{-1}$.

Trevey et al. [see Electrochemistry Communications, 11(9):1830-33, (2009)] used heated mechanical ball milling at about 55° C. to grind and mix the appropriate proportion of $Li_2S$ and $P_2S_5$ crystalline powders for 20 hours to form a glass ceramic powder of $77.5Li_2S-22.5P_2S_5$ having $1.27\times10^{-3}$ S cm$^{-1}$ ionic conductivity. The powder is then pelletized for use in a battery.

The starting raw materials in all these cases are powders of various compounds of elements constituting the electrolyte. In one case, these are used in expensive vacuum systems to deposit thin films of the electrolyte. The use of this process to deposit 0.1 to 2 μm film to block lithium dendrite formation on anode in a liquid electrolyte based lithium-ion battery will incur some price penalty; however, its use in depositing a thicker film suitable for a large format all-solid-state lithium ion battery will be uneconomical. In the other case, the use of ball milling to obtain finer powder appears cumbersome. The integration of glass ceramic electrolyte, obtained from powder melting at high temperature and quenching, in the overall battery fabrication steps is not trivial and may be impossible. However, the option where melt quenching is omitted and pelletization of combined anode, electrolyte, and cathode to fabricate the battery is feasible and slightly less expensive. But one can foresee a bulky battery, perhaps in a coin cell format, with lower energy per unit mass.

What is needed, therefore, is a flexible and economical method for growing thin or thick, high lithium ion conducting solid state electrolyte films where the growth starts from atomic level mixing of most or all of the constituent elements. To reduce the overall battery fabrication cost, the method should also lend itself to seamless integration with other process steps in battery fabrication.

Objects and Advantages

Objects of the present invention include the following: providing a method for making a solid electrolyte having high alkali (preferably lithium) ion conduction; providing a method for making a solid electrolyte by depositing a precursor compound that may be doped with alkali metal and heat treated to create a final electrolyte composition; providing a method for assembling an all solid state lithium battery; providing an improved solid state lithium ion conducting film; and, providing a manufacturing friendly and an improved solid state lithium battery. These and other objects and advantages of the invention will become apparent from consideration of the following specification, read in conjunction with the drawings.

SUMMARY OF THE INVENTION

According to one aspect of the invention, a Li ion conductive electrolyte comprises a compound having the composition $Li_xAl_{z-y}Ga_yS_w(PO_4)_c$ where $4<w<20$, $3<x<10$, $0 \leq y<1$, $1 \leq z<4$, and $0<c<20$.

According to another aspect of the invention, a Li ion conductive electrolyte comprises a compound having the composition $Li_xAl_{z-y}Ga_yS_w(BO_3)_c$ where $4<w<20$, $3<x<10$, $0 \leq y<1$, $1 \leq z<4$, and $0<c<20$.

According to another aspect of the invention, a Li ion conductive electrolyte comprises a compound having the composition $Li_xGe_{z-y}Si_yS_w(PO_4)_c$ where $4<w<20$, $3<x<10$, $0 \leq y<1$, $1 \leq z<4$, and $0<c<20$.

According to another aspect of the invention, a Li ion conductive electrolyte comprises a compound having the composition $Li_xGe_{(z-y)}Si_yS_w(BO_3)_c$ where $4<w<20$, $3<x<10$, $0 \leq y<1$, $1 \leq z<4$, and $0<c<20$.

According to another aspect of the invention, a method of fabricating an alkali ion, preferably Li ion, conductive electrolyte comprises the steps of:

a) depositing an electrolyte matrix material onto a selected substrate, the matrix material comprising a Group III metal (B, Al, Ga) or Group IV metal (Ge, Si), sulfur, and an anion selected from the group consisting of: $BO_3$ and $PO_4$;

b) depositing an alkali metal, preferably Li, onto the matrix material; and, c) annealing at a temperature from about 100 to 500° C. to react the alkali metal and the matrix material to form an electrolyte having ion conducting properties.

According to another aspect of the invention, a method of depositing an alkali metal onto a substrate comprises:

a) positioning the substrate within a deposition chamber containing a selected atmosphere;

b) providing a liquid solution of a salt of a selected alkali metal;

c) dispersing the liquid solution as an atomized mist in a region of the chamber above the substrate;

d) placing a grid between the atomized mist and the substrate, the grid being maintained at a positive DC potential relative to the substrate; and, e) maintaining a temperature of at least 100° C. in the vicinity of the grid, so that volatile components of the liquid solution are vaporized and positive metal ions from the atomized solution are directed to the substrate.

According to another aspect of the invention, an apparatus for depositing a selected alkali metal onto a substrate comprises:

a substrate support;

a liquid solution containing a selected alkali metal;

an atomizing nozzle configured to dispense a mist of the alkali metal solution above the substrate;

a heat source sufficient to maintain a temperature of at least 100° C. in a selected region above the substrate so that volatile components in the liquid solution are vaporized; and, a grid positioned within the selected region above the substrate, the grid maintained at a positive DC potential relative to the substrate so that positive metal ions from the solution are directed to the substrate.

According to another aspect of the invention, a Li ion battery comprises:

a cathode comprising a material selected from the group consisting of: $LiMn_2O_4$, $LiMnNiCoAlO_2$, $LiCoO_2$, $LiNiCoO_2$, and $LiFePO_4$;

an anode material comprising a material selected from the group consisting of: Li and Li alloys or metal oxide doped with Li; and, a solid Li-ion conducting electrolyte selected from the group consisting of: $Li_xAl_{z-y}Ga_yS_w(PO_4)_c$, $Li_xAl_{z-y}Ga_yS_w(BO_3)_c$, $Li_xGe_{z-y}Si_yS_w(PO_4)_c$, and $Li_xGe_{(z-y)}Si_yS_w(BO_3)_c$, where $4<w<20$, $3<x<10$, $0 \leq y<1$, $1 \leq z<4$, and $0<c<20$.

According to another aspect of the invention, a method of making a Li-ion battery comprises the steps of:

a) providing a current collector comprising a metallic sheet;

b) depositing a cathode material on the current collector;

c) depositing an electrolyte matrix material on the cathode material;

d) depositing Li onto the electrolyte matrix;

e) annealing at a temperature from 100 to 500° C. to react the Li and the electrolyte matrix to form a Li ion conducting electrolyte;

f) depositing an anode material onto the Li conducting electrolyte; and, g) applying a current collector to the anode material.

According to another aspect of the invention, a method of making a Li-ion battery comprises the steps of:

a) providing a current collector comprising a metallic sheet;

b) depositing an anode material on the current collector;

c) depositing an electrolyte matrix material on the anode material;

d) depositing Li onto the electrolyte matrix;

e) annealing at a temperature from 100 to 500° C. to react the Li and the electrolyte matrix to form a Li ion conducting electrolyte;

f) depositing a cathode material onto the Li conducting electrolyte; and, g) applying a current collector to the cathode material.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting embodiments illustrated in the drawing figures, wherein like numerals (if they occur in more than one view) designate the same elements. The features in the drawings are not necessarily drawn to scale.

DETAILED DESCRIPTION OF THE INVENTION

Figure 1:
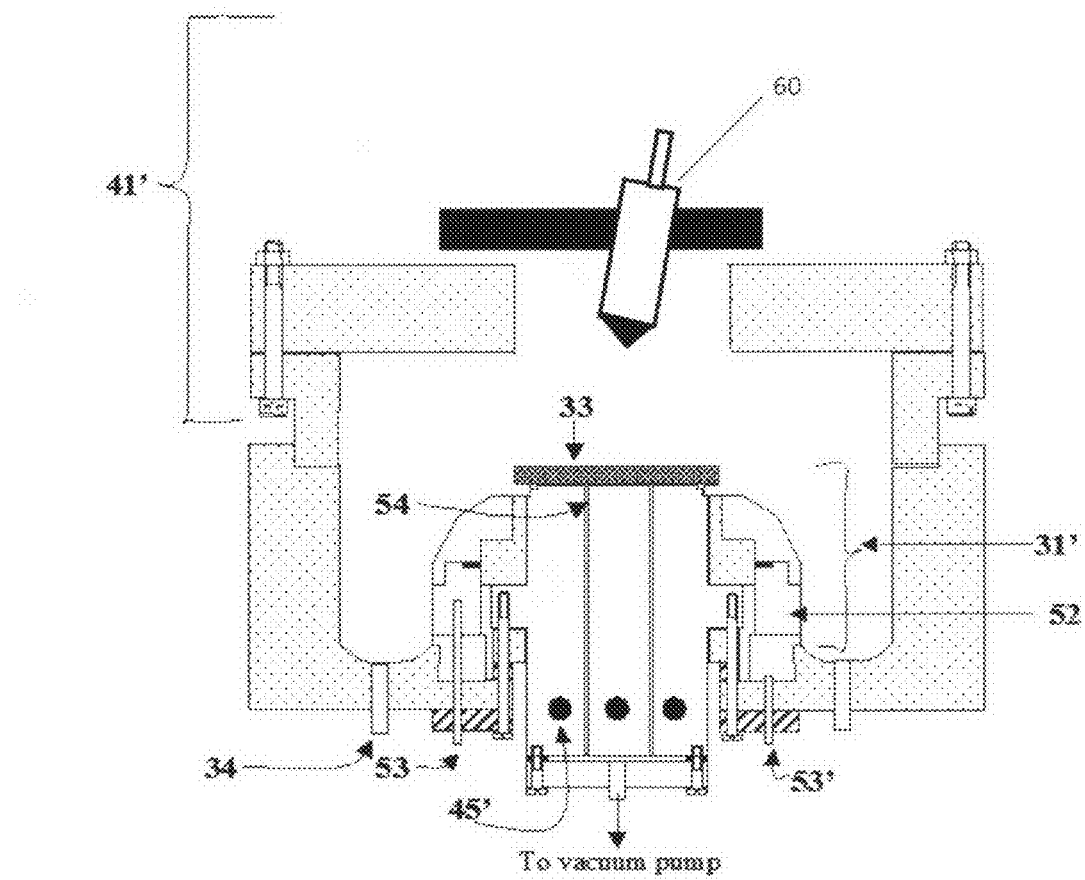
FIG. 1 is a schematic illustration of the VSPEED process according to one aspect of the present invention.

The invention is directed to the growth of thin or thick high alkali metal (preferably lithium) ion conducting solid state electrolyte films where the growth starts from atomic level mixing of most of the constituent elements. The growth uses primary inorganic chemicals, which are preferably water soluble; formulating the solution with appropriate solvent, preferably deionized water, which may include alcohols, glycols, ketones, and other additives; and spray depositing the solid electrolyte matrix on a heated substrate at 100 to 400° C. using spray deposition system, preferably a form of the "Vapor Phase Streaming Process for Electroless Electrochemical Deposition" (VPSPEED) system as described in detail in Applicant's U.S. Pat. No. 7,972,899. The deposition step is then followed by lithiation or addition of lithium, then thermal processing, at temperatures preferably ranging between 100 and 500° C., to obtain a highly lithium ion conducting inorganic solid state electrolyte.

For deionized water as solvent, some solid state electrolytes that Applicant has found to be achievable are, $Li_xAl_{(z-y)}Ga_yS_w(PO_4)_c$ or $Li_xAl_{(z-y)}Ga_yS_w(BO_3)_c$. The matrix is $Al_{(z-y)}Ga_yS_w(PO_4)_c$ for $Li_xAl_{(z-y)}Ga_yS_w(PO_4)_c$, and $Al_{(z-y)}Ga_yS_w(BO_3)_c$ for $Li_xAl_{(z-y)}Ga_yS_w(BO_3)_c$. It may be desirable in some cases to replace Ga in these compounds by boron (B) due to the relatively higher cost of Ga, leading to a nominal formula of $Li_xAl_{(z-y)}[Ga_nB_{1-n}]_yS_w(PO_4)_c$ or $Li_xAl_{(z-y)}[Ga_nB_{1-n}]_yS_w(BO_3)_c$ where $0 \leq n \leq 1$. Applicant contemplates that in some instances, the Ga will be completely replaced by B, i.e., $n \approx 0$ in the general formula given above.

For a solvent other than deionized water, while the above are still achievable, Applicant has found that electrolytes of the form $Li_xGe_{z-y}Si_yS_w(PO_4)_c$ or $Li_xGe_{z-y}Si_yS_w(BO_3)_c$ could also be achieved, with $Ge_{z-y}Si_yS_w(PO_4)_c$ or $Ge_{z-y}Si_yS_w(BO_3)_c$ as the respective matrix.

The preferred chemical reagents are the acetate, sulfate, chloride, citrate, nitrate, or organo-metallics of Al and Ga, as a source for these metals; triacethanolamine or thiourea as ligand and source of sulfur; acetic acid, citric acid, hydrochloric acid, sulfuric acid, nitric acid, or acetonitrile, etc., as additional ligand; and phosphoric acid as a preferred source of phosphate; or boric acid as a preferred source of borate. To replace Ga with B, some preferred sources of B are triethanolamine borate and boron phosphate. These chemicals are mixed together in the desired proportion in the chosen solvent to form a clear solution that is spray deposited to form the electrolyte matrix using VPSPEED as described in the aforementioned U.S. Pat. 7,972,899. To improve the film smoothness alcohol, acetone, methyl propanol, or ethyl glycol, etc., may also be added to the aqueous solution to further reduce the spray mist droplet sizes.

For $Ge_{z-y}Si_yS_w(PO_4)_c$ or $Ge_{z-y}Si_yS_w(BO_3)_c$ some useful sources of Ge or Si are germanium methoxide, ethyltrichlorosilane; triacethanolamine or thiourea as ligand and source of sulfur; acetic acid, citric acid, or acetonitrile, etc., as additional ligand; and naphthyl phosphate as the source of phosphate; or trimethyl borate as the source of borate. These chemicals are mixed together in the desired proportion in the chosen non-aqueous solvent to form a clear solution that is spray deposited to form the electrolyte matrix using VPSPEED as described in the aforementioned U.S. Pat. No. 7,972,899.

The lithiation of matrix may be done by closed-space-sublimation of Li, or vacuum evaporation of Li, or Field Assisted VPSPEED (FAVPSPEED) deposition of Li. The FAVPSPEED is an inventive modification of VPSPEED to allow pure Li metal or other metal deposition, particularly other alkali metals. FAVSPEED is obtained by incorporating a quartz lamp or other suitable heat source in the spray path between the spray nozzle and the substrate, and applying an electric field between the lamp position and the substrate so that the positive metallic ions in the spray plume are directed to the substrate for deposition (as shown schematically in FIG. 2) while the solvent and other volatile species in the spray plume are evaporated before they get to the substrate. The precursor for lithium deposition is a lithium salt dissolved in alcohol (preferably a $C_1$ to $C_4$ alcohol) with acetic acid, citric acid, hydrochloric acid, sulfuric acid, nitric acid, or acetonitrile as additional ligand(s).

The annealing of the lithiated matrix is preferably done at temperatures between about 100 and 500° C. for about 5 to 60 minutes in an enclosed heating apparatus, such as a furnace, rapid thermal annealing system, or flash annealing system to form a highly ion conducting electrolyte. (See FIGS. 3 and 4).

The solid state electrolyte can be deposited on a current collector substrate with pre-coated cathode or current collector substrate with pre-coated anode. It could also be deposited on lithium, magnesium, aluminum foil, or foil of the alloy of these metals or other suitable substrates.

All solid state lithium ion battery cell fabrication using the inventive solid state electrolyte (SSE) may employ any of the schemes described in FIGS. 5 to 8

Various aspects of the invention will be described in greater detail in the Examples that follow, which are exemplary only and are not intended to limit the scope of the invention as claimed.

EXAMPLE

Figure 2:
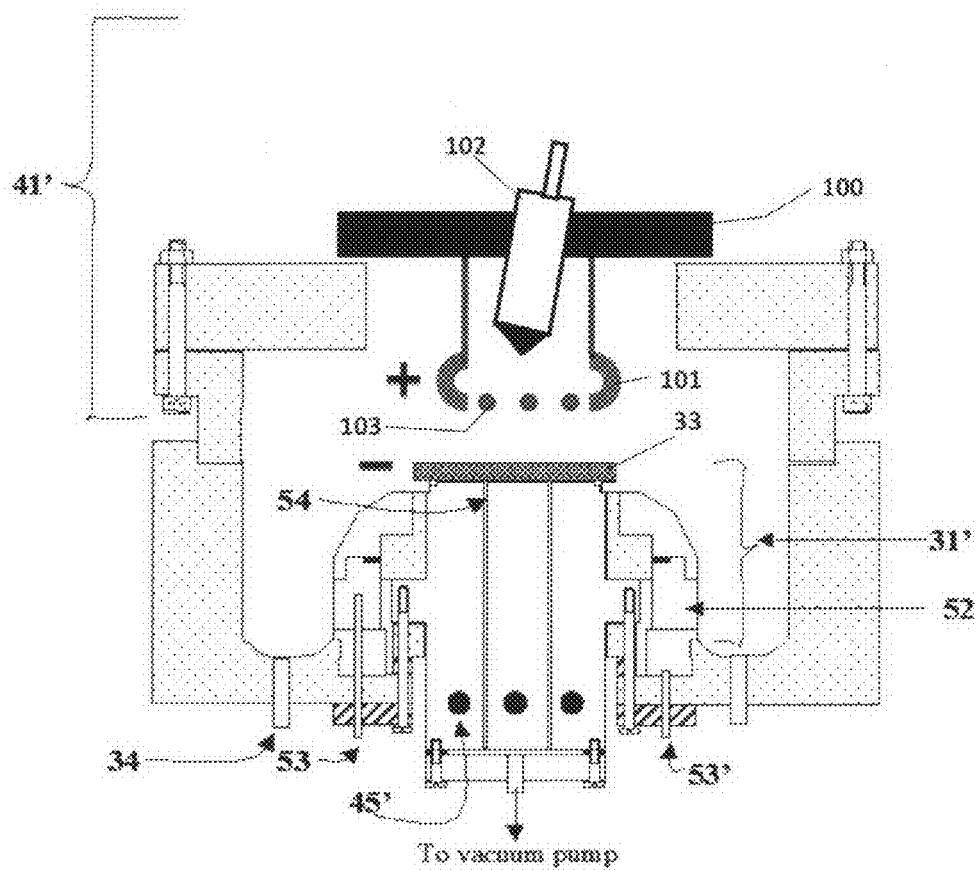
FIG. 2 is a schematic illustration of the Field-Assisted VSPEED process according to another aspect of the present invention.
Figure 3:
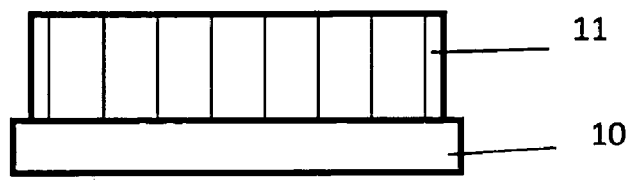
FIG. 3 is a schematic illustration of a process sequence used to form a solid electrolyte.
Figure 3:
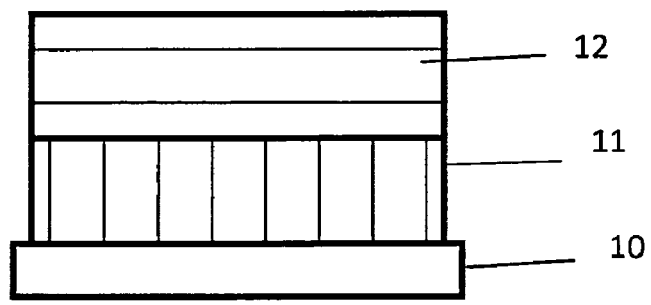
Figure 3:
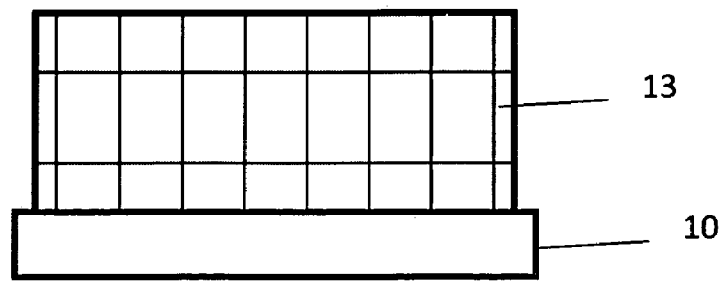

Referring to FIGS. 1-3, the VSPEED process as described in detail in U.S. Pat. No. 7,972,899 was used to deposit AlGaSPO$_4$ 11 onto a metal substrate 10 positioned at 33 in the VSPEED apparatus. An aqueous reagent solution had the following composition: aluminum acetate 0.02M, gallium acetate 0.013M, thiourea 0.2M, and phosphoric acid 3.0M, and acetic acid 0.05M. The solution also contains 5% of alcohol to further reduce the mist droplet sizes. The solution was spray deposited onto the substrate, which was maintained at 200° C., forming a film about 1 μm thick.

EXAMPLE

The film described in the preceding example was then transferred to the traditional vacuum chamber attached to an argon filled glove box. A lithium 12 thickness of about 1 μm was then deposited on the electrolyte matrix 11. The film may alternatively be transferred to a Field-Assisted (FAVPSPEED) deposition apparatus as shown in FIG. 2 in an argon ambient glove box. Li metal 12 can be deposited onto the electrolyte matrix 11 maintained at 150° C. by spray depositing an alcohol solution of LiNO$_3$ 0.3M, nitric acid 0.3M and acetonitrile 0.2M. The grid region is maintained at about 130° C., and the potential deference between the grid and the substrate is about 5V. The lithiated matrix was heat treated in argon filled glove box first at 200° C. for about 20 minutes to diffuse all the lithium in the electrolyte matrix, then at 300° C. for about 20 minutes to create the high lithium ion conducting electrolyte 13 having a final nominal composition of $Li_xAl_{(z-y)}Ga_yS_w(PO_4)_c$.

Those skilled in the art will appreciate that the overall composition may be manipulated over a useful range by varying the relative proportions of the reagents used, and by varying the amount of Li deposited compared to the amount of matrix deposited. Applicant contemplates that useful electrolyte compositions include at least the following:

compounds having the composition $Li_xAl_{z-y}Ga_yS_w(PO_4)_c$ where $4<w<20$, $3<x<10$, $0\leq y<1$, $1\leq z<4$, and $0<c<20$;

compounds having the composition $Li_xAl_{z-y}Ga_yS_w(BO_3)_c$ where $4<w<20$, $3<x<10$, $0\leq y<1$, $1\leq z<4$, and $0<c<20$;

compounds having the composition $Li_xGe_{z-y}Si_yS_w(PO_4)_c$ where $4<w<20$, $3<x<10$, $0\leq y<1$, $1\leq z<4$, and $0<c<20$;

compounds having the composition $Li_xGe_{(z-y)}Si_yS_w(BO_3)_c$ where $4<w<20$, $3<x<10$, $0\leq y<1$, $1\leq z<4$, and $0<c<20$; and, as noted above, Ga may be replaced partially or completely by B.

It will be clear from consideration of the foregoing example that the inventive FAVPSPEED process may be modified in various ways by the skilled artisan through routine experimentation. For instance, other alkali metals such as Na may be deposited using their appropriate salts. Appropriate alkali metal salts include alkali metal chlorides, alkali metal nitrates, alkali metal acetates, and alkali metal alkoxides. The temperature in the grid region may be varied somewhat (typically over the range of 100 to 175° C.) to accommodate the particular solution being used, and the process chamber may be held at a positive or negative pressure relative to ambient to further control the process of vaporization. The chamber atmosphere may be varied depending on the particular application, and may include argon or other inert gas, dry nitrogen, etc. Similarly, the grid potential may be varied over a selected range from about 1 to 10 V, depending on the particular geometry of the apparatus, the size of the substrate, and the spacing between the grid and the substrate.

It is important to emphasize that according to one aspect of the invention, the FAVPSPEED process may be used to deposit an alkali metal such as Li onto a selected matrix compound, it will be understood that many other suitable deposition processes may be used for this step. Thus, the alkali metal may be deposited onto the matrix layer using evaporative coating, sputter deposition, or any other suitable means for depositing a metal onto a surface as are well known in the art.

EXAMPLE

The inventive process may easily be modified to produce other electrolyte compositions. Some suitable aqueous reagent solutions are given in the following table.
$Li_xGa_yS_w(PO_4)_c$
Gallium nitrate 0.033 M
Thiourea 0.2 M
Phosphoric acid 1 M
Nitric acid 0.05M
About 5% volume of the aqueous solution is alcohol.
$Li_xAl_{(z-y)}Ga_yS_w(BO_3)_c$
Aluminum acetate 0.02 M
Gallium acetate 0.013 M
Thiourea 0.2 M
Boric acid 0.5 M
Acetic acid 0.05M About 5% volume of the aqueous solution is alcohol.

It will be appreciated that the inventive process may be modified through routine experimentation to produce many other useful compositions. For example, β"-alumina is a well-known solid ionic conductor, which can be prepared with various mobile ionic species, including $Na^+$, $K^+$, $Li^+$, $Ag^+$, $H^+$, $Pb^{2+}$, $Sr^{2+}$, and $Ba^{2+}$ while maintaining low electronic conductivity. Furthermore, other dopant species may be added to modify the ionic conductivity, particularly to lower the activation energy, thereby improving low-temperature conductivity. The skilled artisan can, therefore, use the inventive VPSPEED process (or other suitable deposition process) to deposit a film comprising aluminum oxide (and any metallic dopants) and then use the FAVPSPEED process to deposit the desired mobile ionic species, followed by annealing to form the desired β"-alumina structure.

It will be further appreciated that solid ionic conductors are used for many applications besides solid state batteries. For example, β"-alumina is used in high temperature liquid batteries such as various sodium-sulfur cells, and is also used in high temperature thermoelectric convertors. Solid ionic conductors are also useful in applications such as sensors of various kinds, electrochromic windows, and dye sensitized solar cells.

EXAMPLE

Figure 4:
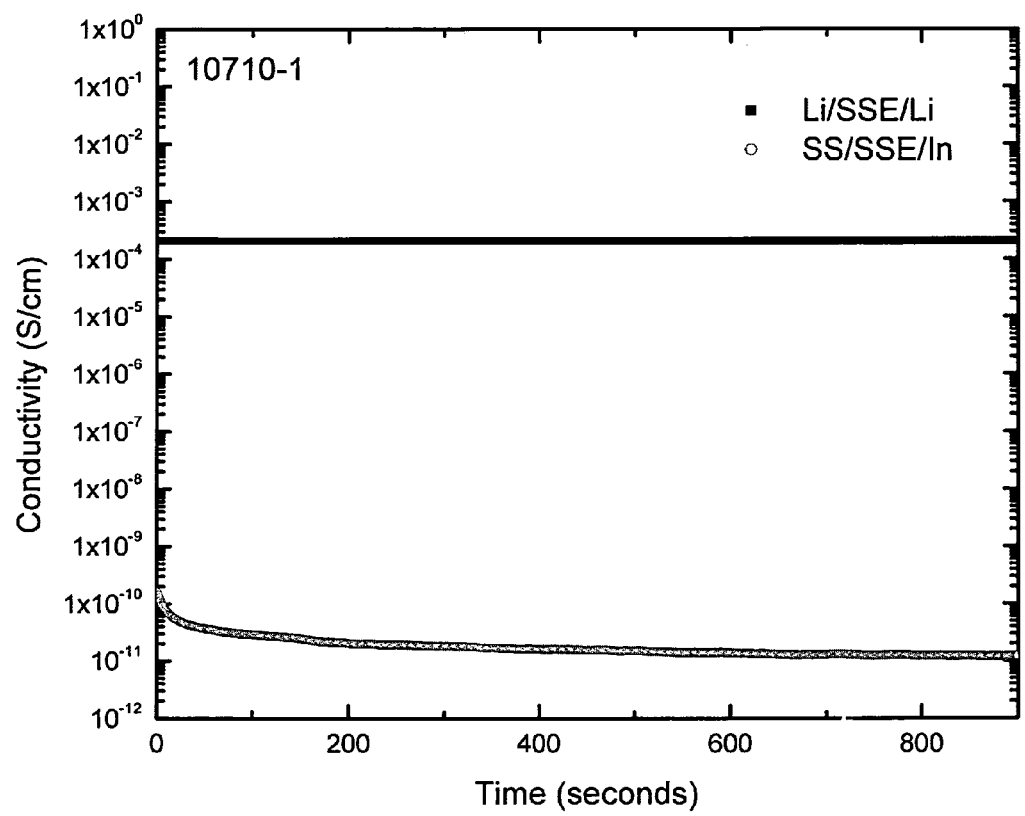
FIG. 4 is an illustration of some properties of an electrolyte produced by the inventive process.

FIG. 4 illustrates the electrical characteristics of a solid state electrolyte (SSE) made according to the invention. The electrolyte had a nominal composition of $LiAlGaSPO_4$, with Al:Ga=3:2 and Li:$AlGaSPO_4$=1:1 (by thickness). Annealing was done at 200-300° C. in an argon filled glove box. The Li/SSE/Li and SS/SSE/Li structures where then packaged in a sealed pouch with appropriate leads. The DC transient measurement was then made by subjecting each structure to a constant voltage of 0.1 V while recording the current over 900 seconds. The resistance and conductivity are then computed. The Li/SSE/Li structure gives the ionic conductivity of $10^{-4}$ S/cm, and the SS/SSE/In structure gives the electronic conductivity of about $10^{-11}$ S/cm. One can see that ionic conductivity ($10^{-4}$ S/cm) is 6-7 orders of magnitude greater than electronic conductivity. Through routine experimentation, the ionic conductivity can be further improved by optimizing conditions for a particular composition, perhaps to as high as $10^{-3}$ S/cm.

One electrolyte that exhibited ionic conductivity of about $10^{-4}$ S/cm was analyzed and had a final composition that is represented approximately by the formula $Li_8Al_{1.13}GaS_5(PO_4)_{1.2}$ (major elements determined by EDX, Li calculated by difference).

Building on the foregoing examples, the invention may be further extended to fabricate an all solid-state Li ion battery in several ways, as described in the following examples.

EXAMPLE

Figure 5:
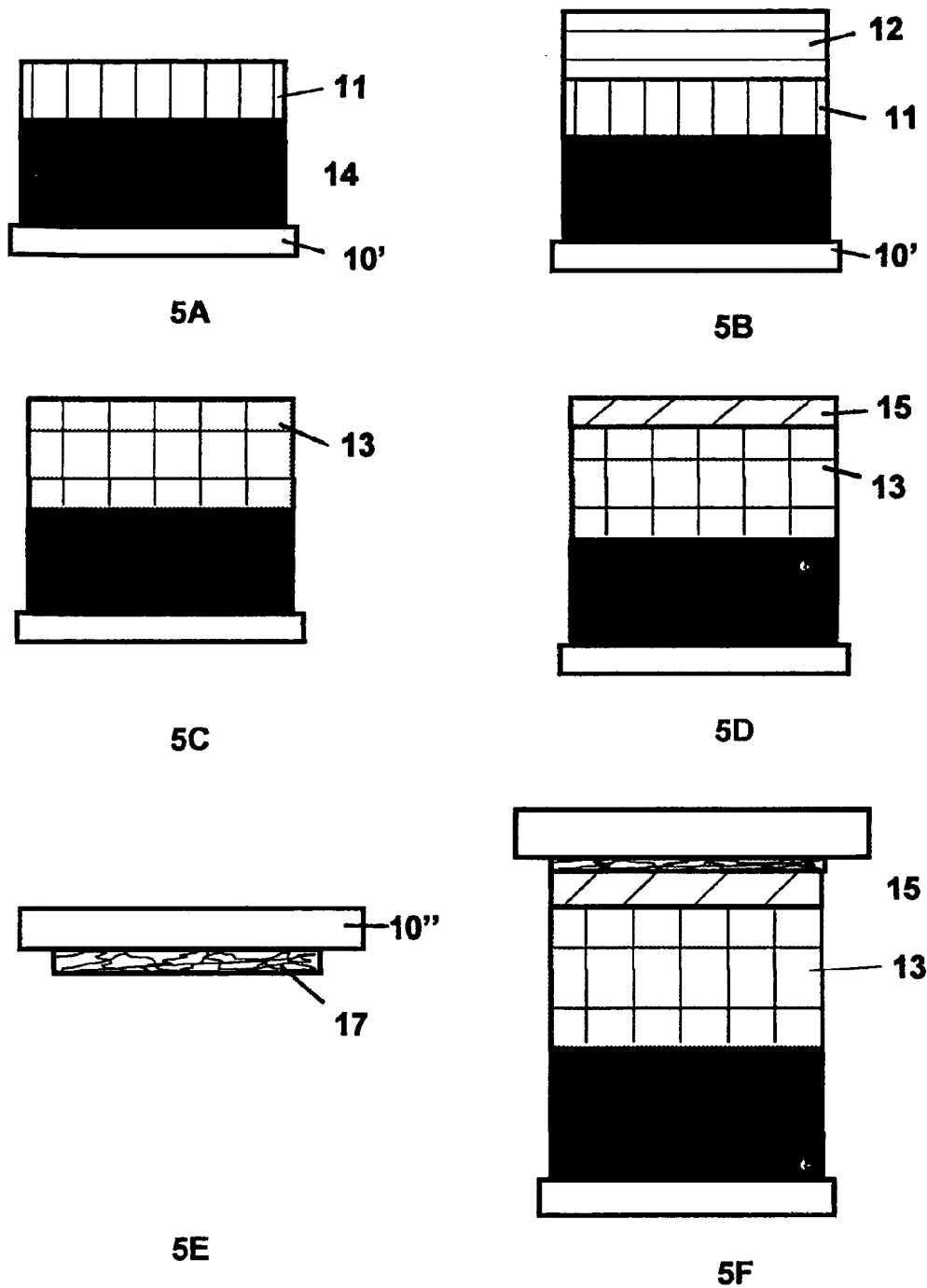
FIG. 5 is a schematic illustration of a process sequence used to form a solid state battery.

Referring to FIG. 5, a current collector 10' (Al, Cu, or other suitable metal foil) is coated with cathode material 14 which is preferably $LiMn_2O_4$, $LiMnNiCoAlO_2$, $LiFePO_4$, etc., deposited by VPSPEED or other suitable techniques. Following the procedure described in the foregoing examples, electrolyte matrix 11 is deposited, Li 12 is deposited by FAVSPEED or traditional vacuum technique, and the coating is heat treated to form a solid electrolyte 13. Next, anode 15 (Li, Li-Al, or Li-Mg) is deposited on electrolyte 13 by FAVPSPEED or traditional vacuum technique. Another current collector 10" is coated with a layer 17 of conductive silver/aluminium adhesive (e.g., Silfill Conductive Adhesive, P & P Technology Ltd., Finch Dr., Springwood, Braintree, Essex CM72SF, England); and the conductive paste 17 is pressed into contact with the Li-containing anode 15, thereby completing the cell.

EXAMPLE

Figure 6:
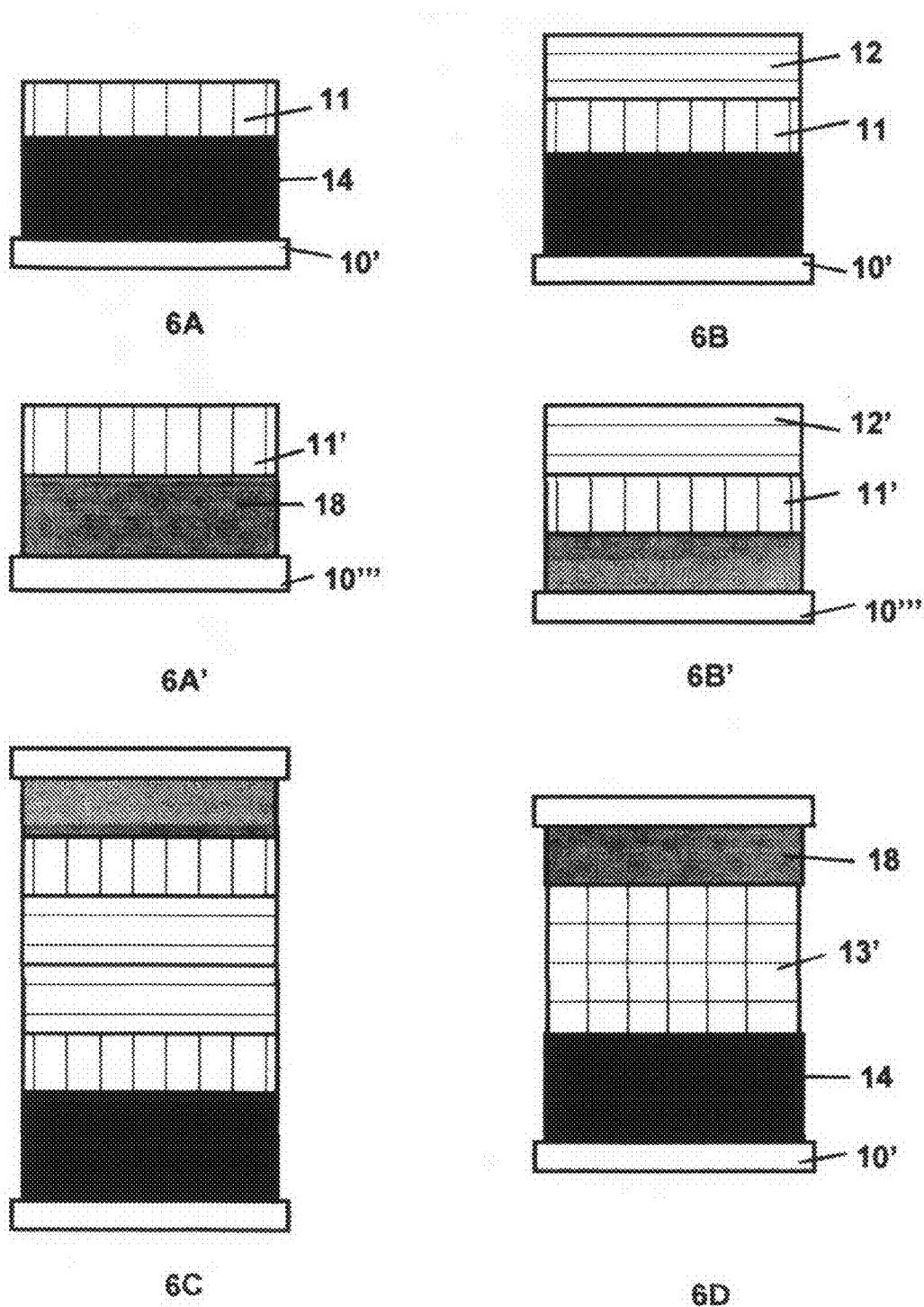
FIG. 6 is a schematic illustration of another process sequence used to form a solid state battery.

Referring to FIG. 6, cathode material 14 is applied to a first current collector 10', electrolyte matrix 11 is deposited, and Li 12 is deposited. Anode material 18 is deposited on a second current collector 10''', electrolyte matrix 11' and Li 12' are deposited on anode 18. In some cases the electrolyte matrix 11' deposition on anode material 18 may be omitted. The two coated stacks are placed face-to-face so that the Li-coated surfaces are in contact, and pressure is applied to compress the stack while it is heated; the reaction between the Li and the two layers of electrolyte matrix forms a continuous solid electrolyte layer as well as a mechanical bond, thereby completing the cell.

EXAMPLE

Figure 7:
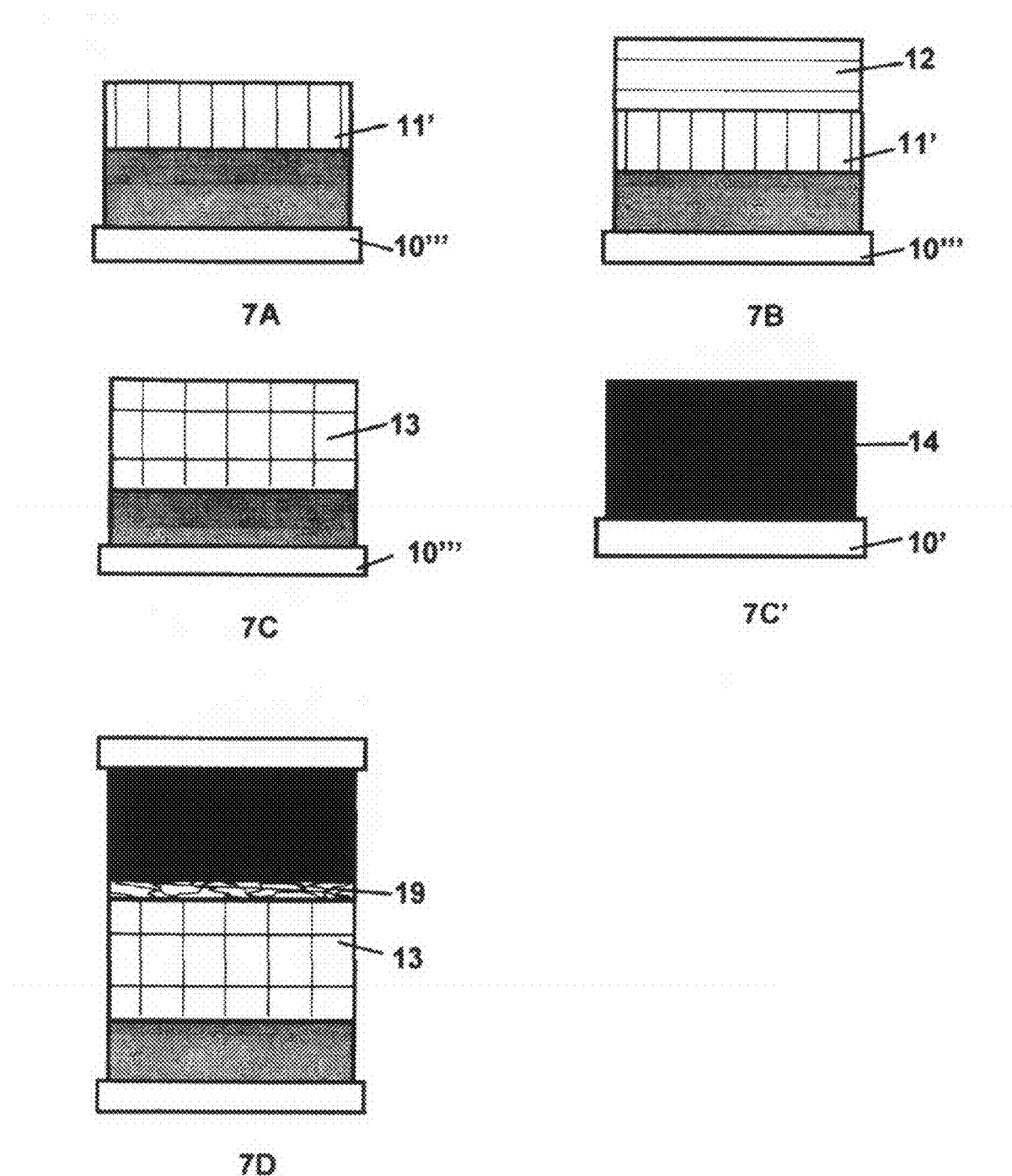
FIG. 7 is a schematic illustration of another process sequence used to form a solid state battery.
Figure 8:
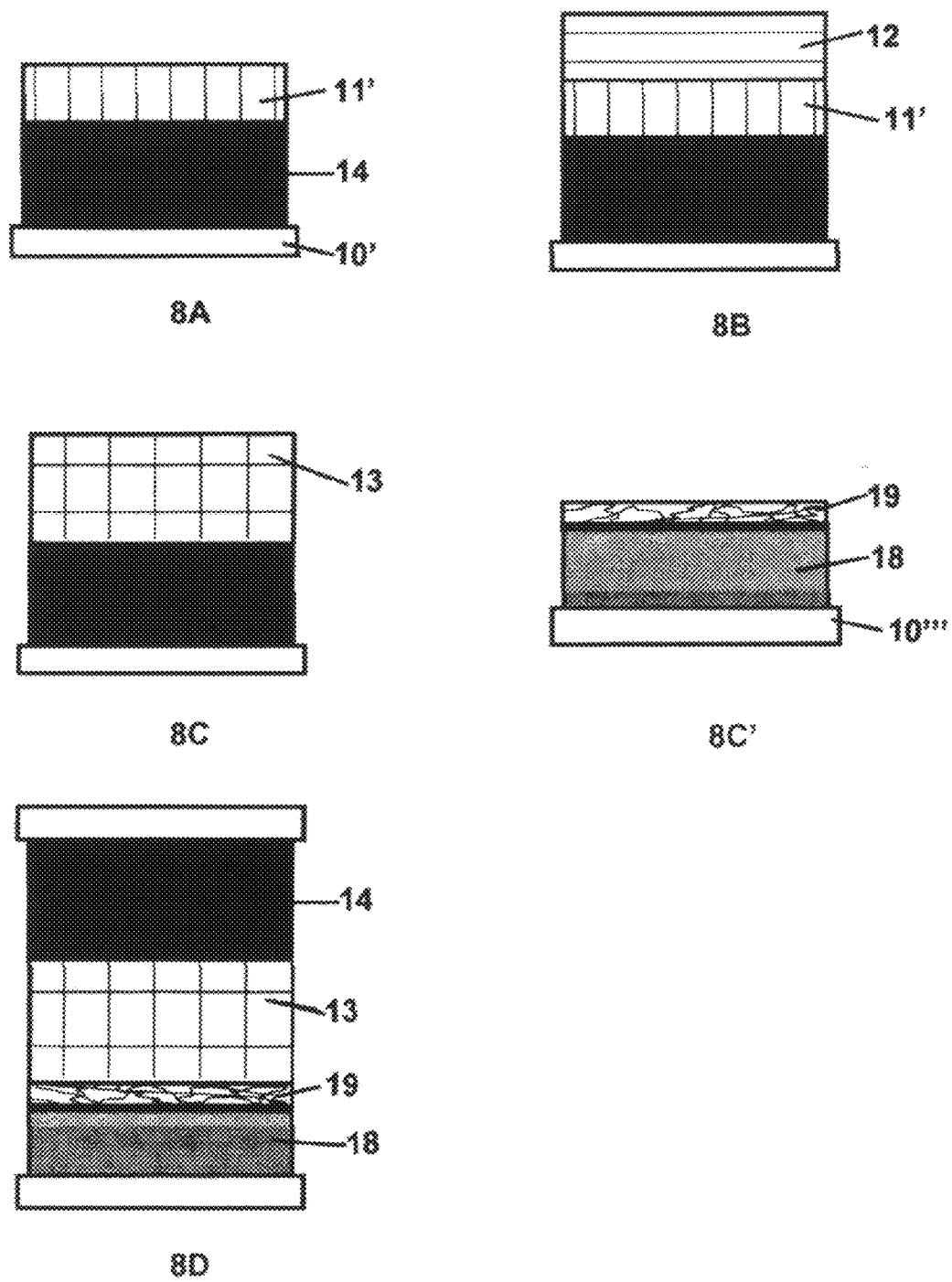
FIG. 8 is a schematic illustration of another process sequence used to form a solid state battery.

Referring to FIG. 7, electrolyte matrix 11' may be deposited on an anode-coated substrate 10''' as shown earlier in FIG. 6. Li 12 is deposited and reacted as before to form electrolyte 13. Substrate 10' is coated with cathode material 14 and then a layer of Li-ion conductive adhesive 19 is applied. The adhesive is a reported mixture of polyvinylidene fluoride/hexafluoropropylene copolymer (PVDF/HFP), dissolved in dimethoxyethane (DME), and 1.5M LiPF$_6$ in EC/PC 30% solution heated to 50° C. in closed vessel, then cool to room temperature. The two halves of the cell are hot pressed together using the ion-conductive adhesive 19 to form an ion-conductive mechanical bond, thereby completing the cell. It will be appreciated that the ion-conductive adhesive 19 may alternatively be applied to the anode-coated substrate as shown schematically in FIG. 8.

For simplicity, the foregoing examples depict a single substrate of some fixed dimensions. However, Applicant emphasizes that the invention may also be carried out in a semi-continuous or reel-to-reel format in which the substrate or current collector is a substantially continuous, flexible sheet, which is indexed through the deposition environment in a step-wise manner so that many thin-film cells may be fabricated efficiently and later diced into individual cells if desired. The substrate may have a physical support directly under the area being coated, or it may be supported in tension simply by passing it over two appropriately positioned rollers. A reel-to-reel setup is taught in detail in Applicant's U.S. Pat. No. 7,700,161 and U.S. patent application Ser. No. 12/151,465.

I claim:

1. A method of making a Li-ion battery comprising the steps of:
    a) providing a first current collector comprising a metallic sheet;
    b) depositing a cathode material on said first current collector;
    c) depositing an electrolyte matrix material on said cathode material;
    d) depositing Li onto said electrolyte matrix;
    e) annealing at a temperature from 100 to 500° C. to react said Li and said electrolyte matrix to form a Li ion conducting electrolyte;
    f) depositing an anode material onto said Li conducting electrolyte; and,
    g) applying a second current collector to said anode material.

2. The method of claim 1 wherein said first current collector comprises a foil selected from the group consisting of Al, Cu, and their alloys.

3. The method of claim 1 wherein said cathode material is selected from the group consisting of: $LiMn_2O_4$, $LiMnNiCoAlO_2$, and $LiFePO_4$.

4. The method of claim 1 wherein said electrolyte matrix material comprises: a metal selected from the group consisting of: B, Al, Ga, Ge, and Si; sulfur; and an anion selected from the group consisting of: $BO_3^{3-}$ and $PO_4^{3-}$.

5. The method of claim 1 wherein said anode material is selected from the group consisting of Li, Li-Al alloys, and Li-Mg alloys.

6. The method of claim 1 wherein said second current collector comprises a metal foil, and further comprising affixing said second current collector onto said anode material using conductive adhesive.

7. A method of making a Li-ion battery comprising the steps of:
    a) providing a first current collector comprising a metallic sheet;
    b) depositing an anode material on said first current collector;
    c) depositing an electrolyte matrix material on said anode material;
    d) depositing Li onto said electrolyte matrix;
    e) annealing at a temperature from 100 to 500° C. to react said Li and said electrolyte matrix to form a Li ion conducting electrolyte;
    f) depositing a cathode material onto said Li conducting electrolyte; and,
    g) applying a second current collector to said cathode material.

8. The method of claim 7 wherein said first current collector comprises a foil selected from the group consisting of Al, Cu, and their alloys.

9. The method of claim 7 wherein said cathode material is selected from the group consisting of: $LiMn_2O_4$, $LiMnNiCoAlO_2$, and $LiFePO_4$.

10. The method of claim 7 wherein said electrolyte matrix material comprises: a metal selected from the group consisting of: B, Al, Ga, Ge, and Si; sulfur; and an anion selected from the group consisting of: $BO_3^{3-}$ and $PO_4^{3-}$.

11. The method of claim 7 wherein said anode material is selected from the group consisting of Li, Li-Al alloys, and Li-Mg alloys.

12. The method of claim 7 wherein said second current collector comprises a metal foil, and further comprises affixing said second current collector onto said cathode material using conductive adhesive.

* * * * *